United States Patent [19]

Jenq

[11] Patent Number: 4,791,600
[45] Date of Patent: Dec. 13, 1988

[54] DIGITAL PIPELINED HETERODYNE CIRCUIT

[75] Inventor: Yih-Chyun Jenq, Lake Oswego, Oreg.

[73] Assignee: Tektronix, Inc., Beaverton, Oreg.

[21] Appl. No.: 890,192

[22] Filed: Jul. 28, 1986

[51] Int. Cl.[4] .............................................. G06F 7/52
[52] U.S. Cl. ................................................... 364/754
[58] Field of Search .............................. 364/754–757, 364/736, 725–726, 724, 715

[56] References Cited

U.S. PATENT DOCUMENTS

| | | | |
|---|---|---|---|
| 4,223,185 | 9/1980 | Picou | 364/726 |
| 4,611,305 | 9/1986 | Iwase | 364/754 |
| 4,698,769 | 10/1987 | McPherson et al. | 364/726 |

FOREIGN PATENT DOCUMENTS 2155669  9/1985  United Kingdom ................ 364/754

Primary Examiner—Gary V. Harkcom
Assistant Examiner—Long Thanh Nguyen
Attorney, Agent, or Firm—William O. Geny; Robert S. Hulse

[57] ABSTRACT

A digital pipelined heterodyne circuit includes sine and cosine function generators for generating m-bit digital coefficients and an m-stage digital multiplier for multiplying the coefficients by a digitized data input signal. A triangular shift register array connects the digital sine and cosine function generators with the multiplier stages and provides for simultaneous processing of successive bytes of input data at each multiplier stage by delaying the arrival of coefficient bits at each multiplier stage to coincide with the arrival of a predetermined data byte. This takes place simultaneously in all stages thereby decreasing the processing time by a factor of m.

7 Claims, 2 Drawing Sheets

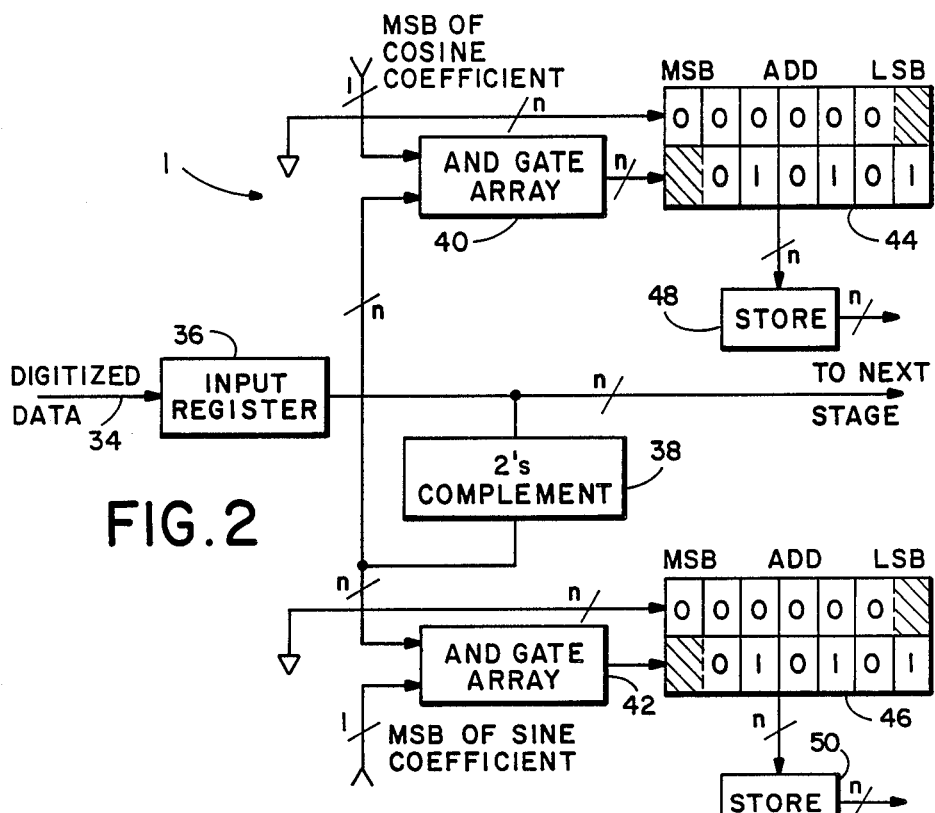
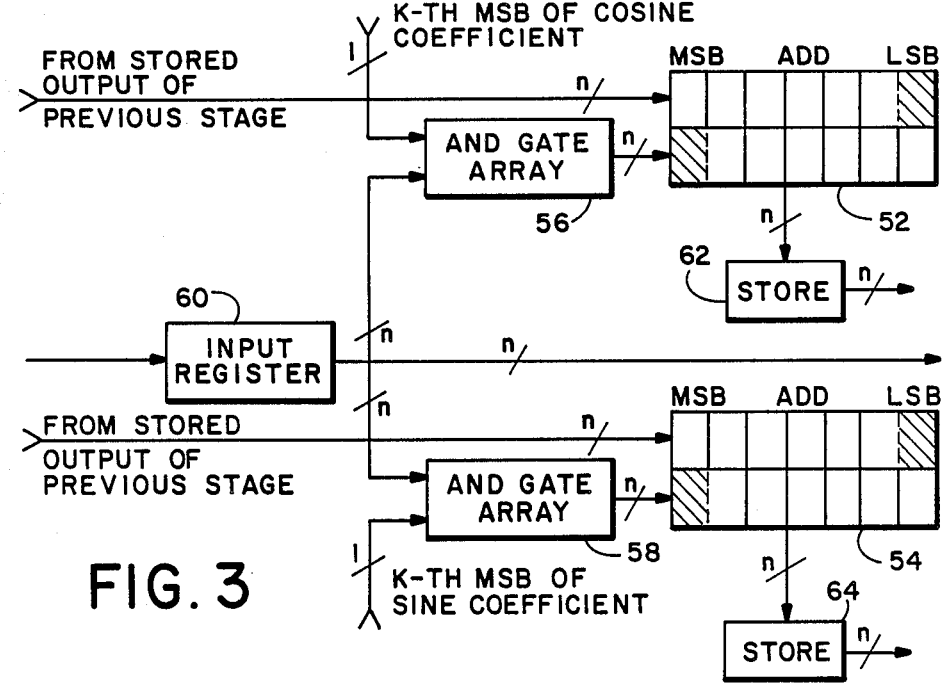

4,791,600

DIGITAL PIPELINED HETERODYNE CIRCUIT

BACKGROUND OF THE INVENTION

The present invention relates to a digital pipelined heterodyne circuit for heterodyning a data input signal by a signal of a predetermined frequency.

Heterodyning is a technique that has application in many areas of communiations and signal processing. For example, in spectrum analysis, it is often necessary to shift the center frequency of a broad-band signal into a region where a narrow-band filter may be located which is used to sample input data. In order to accomplish this function, digital heterodyne circuits are available which digitize a data input signal and multiply that signal by the sine and cosine components of a user-chosen reference signal having a predetermined frequency. The problem with such circuits is that each data byte must be digitally multiplied by digital sine and cosine coefficients one at a time. Digital multiplication is a two-step process involving the combining of one bit of the sine and cosine coefficient with the data byte in an AND-gate array and then adding the product to the previous product formed by the previous gate array. It will take as many steps to completely multiply the data byte as there are bits in the sine and cosine coefficients. For example, if there are m significant bits, each data input byte must be processed, one bit at a time, m times, before the next byte can be processed. This leads to unacceptably slow processing time, especially if high resolution is required.

SUMMARY OF THE INVENTION

The present invention provides a digital heterodyne circuit which includes a data input line for providing a sequence of digitized data signals and digital sine and cosine function generators for generating m-bit digital coefficients as a function of time at a predetermined frequency. An m-stage digital multiplier is provided for multiplying the digitized data signals by the coefficients generated by the sine and cosine function generators. Time delay circuits are connected between the function generators and the m-stage multiplier for providing each bit of each digital coefficient to each respective stage of the multiplier means simultaneously with the arrival at each such stage of a predetermined digitized data signal.

This circuit provides a pipelined heterodyne circuit in which data input bytes are sequentially processed such that each time a data byte enters a particular stage for partial multiplication, the previous data byte is being processed downstream in the next stage. As each data byte proceeds sequentially from one stage to the next, a unique shift register makes available an additional bit of digital sine and cosine coefficients that were generated when the byte first entered the data input. This is made possible by a unique triangular shift register in which the number of stages of the shift register connecting each bit output of the sine and cosine function generators with each respective stage of the multiplier includes the same number of stages as the rank in significance of the particular bit. Thus, the most significant bit output of the sine and cosine function generators include a one-stage shift register. The second most significant bit includes a two-stage shift register, and so on, up to an m-stage shift register connecting the $m^{th}$ significant bit with the $m^{th}$ multiplication stage. This circuit provides an increase in speed over conventional digital heterodyne circuits by a factor of m where m is the number of significant bits produced by the sine and cosine function generators. The output is filtered in a low-pass decimation filter.

It is a principal object of this invention to provide a digital pipelined heterodyne circuit for increasing the speed of digitally heterodyning an input data signal with a signal of a given frequency.

BRIEF DESCRIPTION OF THE DRAWINGS

FIG. 2 is a block schematic diagram of multiplier stage member 1 shown in FIG. 1.

FIG. 3 is a block schematic diagram of a circuit utilized in multiplier stages 2 through m in FIG. 1.

DETAILED DESCRIPTION OF THE INVENTION

Figure 1:
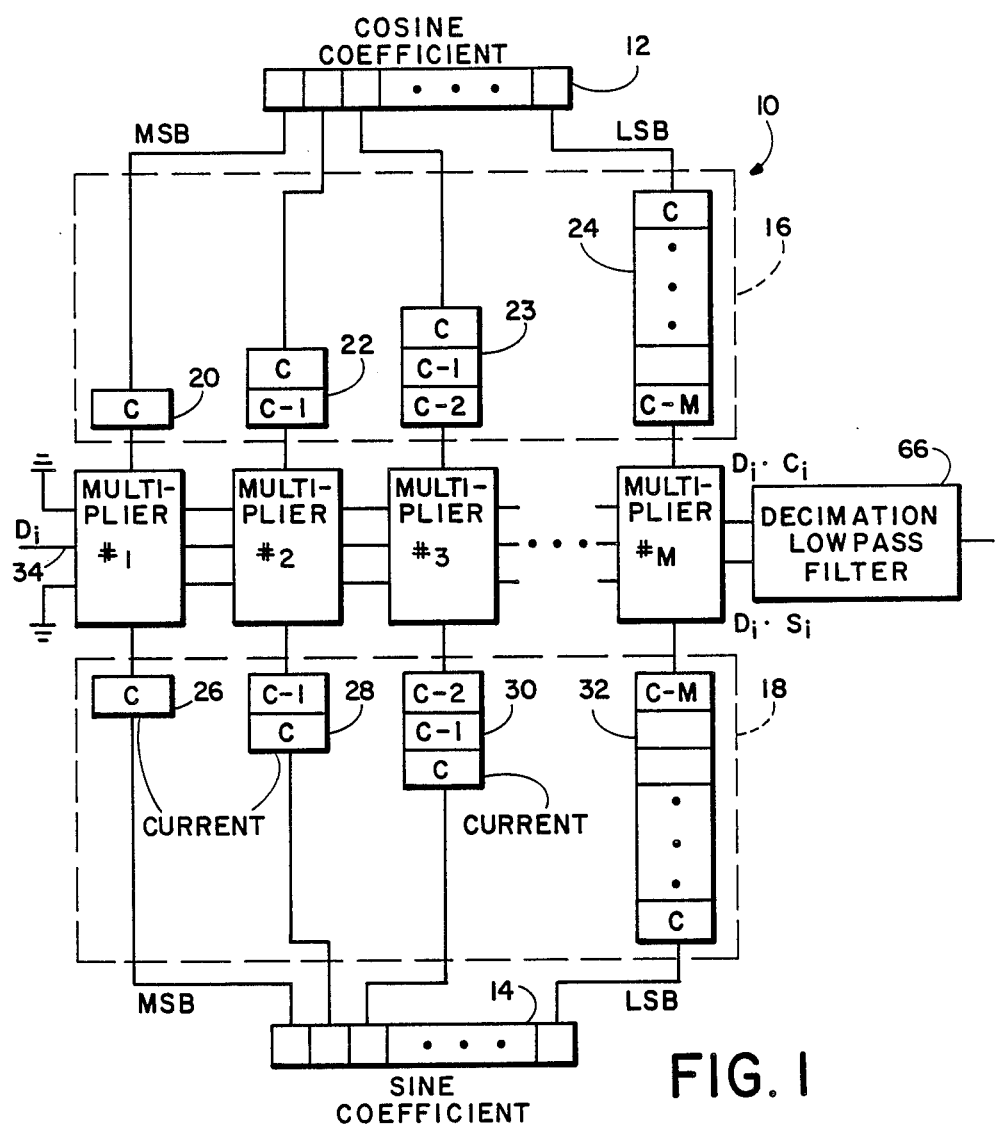
FIG. 1 is a block schematic diagram of the digital heterodyne circuit of the present invention.

A digital heterodyne circuit 10 includes a cosine coefficient generator 12 and a sine coefficient generator 14. Cosine coefficient generator 12 is connected to a triangular shift register 16, and sine coefficient generator 14 is connected to a similar triangular shift register 18. Each of the triangular shift registers 16 and 18 comprise a number of individual single-stage or multi-stage shift registers for each bit output of respective cosine and sine coefficient generators 12 and 14. For example, the most significant bit output of cosine coefficient generator 12 is connected to a single-stage shift register 20, while the next two significant bits of cosine coefficient generator 12 are connected to two-stage shift register 22 and three-stage shift register 23. The least significant bit of the cosine coefficient generator 12 is connected to an m stage shift register 24. The connections between the sine coefficient generator 14 and triangular shift register 18 are the same as those described with respect to cosine coefficient generator 12. The most significant bit of sine coefficient generator 14 is connected to single-stage shift register 26. The next most significant bit of sine coefficient generator 14 is connected to two-stage shift register 28, as is the next most significant bit connected to three-stage shift register 30. The least significant bit of sine coefficient generator 14 is connected to m-stage shift register 32.

A digitized data signal Di enters on data input line 34 where it is multiplied in multiplier 1 by the output of the most significant bit shift registers 20 and 26 respectively. If the data signal at multiplier 1 is arbitrarily designated as the current data input, it can be seen that the current digital cosine and sine coefficients, which are labelled with the letter "c", are loaded into the triangular shift registers 16 and 18, respectively. This happens each time a new data input signal Di is provided to multiplier 1. A system clock (not shown) clocks a data byte into multiplier 1 and simultaneously enables the cosine and sine function generators 12 and 14 to generate a new m-bit coefficient to be loaded into shift registers 16 and 18, respectively. Thus, at predetermined time intervals, the cosine and sine coefficient generators 12 and 14 load a digital coefficient representing the sine function and cosine functions respectively of an angle $\omega t$ which varies with time where $\omega$ is a predetermined frequency chosen by the user.

Downstream from multiplier 1, in multiplier 2, the previous data input signal is simultaneously processed by the previous cosine and sine coefficients labelled c−1, and in the $m^{th}$ multiplier stage, multiplier m, the $m^{th}$ previous data input signal is being processed by the c−m cosine and sine coefficients, respectively. Thus, as a data input signal enters the "pipeline" at multiplier 1, it will be partially multiplied in each of the multipliers by a bit generated by cosine coefficient generator 12 and sine coefficient generator 14 of sine and cosine coefficients respectively that were generated at the particular time that the data signal was clocked into multiplier 1. Simultaneously, other data signals are multiplied by different bits of different sine and cosine coefficients that were generated at earlier times. In this way, as a data input signal progresses through each of the multiplier stages, being partially multiplied each time by one bit of the same sine and cosine coefficients, other data signals are being simultaneously processed in other multiplier stages by partial multiplication using the appropriately generated bits of the sine and cosine coefficients. This speeds up the multiplication process by a factor of m.

Referring to FIG. 2, multiplier 1 is a digital multiplier includes an input register 36 which is connected to data input line 34. The input register 36 is connected to a 2's complement generator 38 which simultaneously provides the 2's complement of each data byte stored in the input register 36 to AND gate arrays 40 and 42, respectively. The n bits of the output of 2's complement generator 38 are provided to a set of parallel AND gates which are all combined with the most significant bit of the sine and cosine coefficients, respectively. The 2's complement of each data input signal is used for this purpose in order to properly maintain the word length of the data input signals which ma change in polarity from plus to minus. The outputs of AND gate arrays 40 and 42, respectively, are provided to adders 44 and 46, respectively, which add the input data signal multiplied by the most significant bit of the cosine and sine coefficients, respectively to an n-bit ground signal. The sum of these two numbers is stored in storage registers 48 and 50, respectively. These signals, along with the data input signal, are provided to the next multiplier stage.

The following multiplier stages are shown in FIG. 3. For each such stage, an input line from the stored output of the previous stage is provided to adders 52 and 54, respectively. The $k^{th}$ most significant bits of the cosine and sine coefficient generators 12 and 14 are provided to AND gate arrays 56 and 58, respectively. This bit is combined with the input data signal held in input register 60. The output of AND gate arrays 56 and 58 are added to the stored output of the previous stage in adders 53 and 54, and the results are stored in storage registers 62 and 64, respectively.

Referring again to FIG. 1, the last multiplier stage, labelled multiplier M in FIG. 1, passes the outputs of its storage registers, which are now the product of digitized input signal $D_i$ and a sine and cosine coefficient labelled $S_i$ and $C_i$, respectively, to a decimation low-pass filter 66 for the purpose of removing transient noise.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A digital heterodyne circuit comprising:
   (a) a data input line for receiving a sequence of digitized data signals;
   (b) digital sine and co-sine function generator means, each having m outputs for generating m-bit digital coefficients, one bit on each output, a predetermined time intervals as a function of time corresponding to sine $\omega t$ and co-sine $\omega t$, respectively, where $\omega$ is a predetermined frequency;
   (c) m-stage arithmetic means for multiplying said data signals by said digital coefficients; and
   (d) delay means connecting said output of said function generator means for a corresponding stage of said arithmetic means for providing each respective bit of a digital coefficient to each such corresponding stage of said arithmetic means simultaneously with the arrival at each such corresponding stage of a predetermined one of said data signals.

2. The digital heterodyne circuit of claim 1 wherein said delay means comprises a plurality of shift registers, one for each said output of said function generator means, each of said shift registers having a respective different number of sequential stages, the number of sequential stages in each of said shift registers corresponding to the rank in significance of each output of each function generator means to which each said shift register is connected.

3. The digital heterodyne circuit of claim 2 wherein a first stage of said arithmetic means comprises means for converting input data signals to their two's complements, and for multiplying each of said two's complements by the most significant bit of said sine and cosine coefficients to form a first arithmetic stage product.

4. The digital heterodyne circuit of claim 1 wherein an m-bit digital coefficient is generated by said sine and cosine function generator means as each digitized data signal is received on said data input line.

5. A digital heterodyne circuit comprising:
   (a) a data input line for providing a digitized data input signal;
   (b) digital sine and cosine function generator means for generating m-bit digital coefficients at a predetermined frequency;
   (c) first arithmetic stage means for digitally multiplying the most significant bit of each m-bit coefficient, from said function generator means by a first data input signal, thereby producing a first product output;
   (d) second arithmetic stage means for digitally multiplying the next most significant bit of said m-bit coefficients from said function generator means by said first output product, thereby producing a second output product;
   (e) $m^{th}$ arithmetic stage means for multiplying the least significant bit of said m-bit coefficients from said function generator means by the (m-l)th output product, thereby producing a heterodyned data signal; and
   (f) triangular shift register means for providing each bit of said m-bit coefficients to each of said arithmetic stage means in timed relation such that said data input signal is processed sequentially by each of said arithmetic stage means simultaneously with the sequential processing of other data input signals.

6. The digital heterodyne circuit of claim 5 wherein said digital sine and cosine function generator means comprise separate sine and cosine function generators for producing separate sets of m-bit digital coefficients.

7. The digital heterodyne circuit of claim 6 wherein said triangular shift register means comprises a plurality of shift registers, one for each bit of said digital sine and co-sine coefficients, wherein each shift register includes a number of stages corresponding to the ranking in significance of each bit of said coefficients.

* * * * *